United States Patent [19]

Suwa

[11] Patent Number: 5,736,894
[45] Date of Patent: Apr. 7, 1998

[54] SEMICONDUCTOR DEVICE AND METHOD OF ADJUSTING INTERNAL POWER SUPPLY POTENTIAL OF THE SEMICONDUCTOR DEVICE

[75] Inventor: Makoto Suwa, Hyogo, Japan

[73] Assignee: Mitsubishi Denki Kabushiki Kaisha, Tokyo, Japan

[21] Appl. No.: 559,052

[22] Filed: Nov. 16, 1995

[30] Foreign Application Priority Data

Apr. 26, 1995 [JP] Japan ................. 7-102254

[51] Int. Cl.[6] ............................. G05F 1/10
[52] U.S. Cl. .................. 327/538; 327/530; 327/540
[58] Field of Search ...................... 327/530, 538, 327/540, 543, 535, 541; 365/189.09

[56] References Cited

U.S. PATENT DOCUMENTS

| 5,249,155 | 9/1993 | Arimoto et al. | 365/222 |
| 5,305,275 | 4/1994 | Yamashita et al. | 365/226 |
| 5,426,616 | 6/1995 | Kajigaya et al. | 365/226 |
| 5,459,426 | 10/1995 | Hori | 327/538 |
| 5,554,953 | 9/1996 | Shibayama et al. | 327/541 |

FOREIGN PATENT DOCUMENTS 4-263193  9/1982  Japan .

*Primary Examiner*—Timothy P. Callahan
*Assistant Examiner*—Jung Ho Kim
*Attorney, Agent, or Firm*—Lowe, Price, LeBlanc & Becker

[57] ABSTRACT

In a level generating circuit 1 included in an internal power supply circuit of a DRAM, MOS transistors 14 and 16 for inactivating a $V_1$ generating circuit 3, and MOS transistors 23 and 25 for inactivating a $V_2$ generating circuit 5 are provided. When $V_1$ is to be adjusted, $V_2$ generating circuit 5 is inactivated, and when $V_2$ is to be adjusted, $V_1$ generating circuit 3 is inactivated. Therefore, failure of adjustment of internal power supply potential intVcc caused by confusion of $V_1$ and $V_2$ can be prevented.

10 Claims, 10 Drawing Sheets

SEMICONDUCTOR DEVICE AND METHOD OF ADJUSTING INTERNAL POWER SUPPLY POTENTIAL OF THE SEMICONDUCTOR DEVICE

BACKGROUND OF THE INVENTION

1. Field of the Invention

The present invention relates to a semiconductor device and a method of adjusting internal power supply potential of the semiconductor device. More specifically, the present invention relates to a semiconductor device to which an external power supply potential and a ground potential are applied and which performs prescribed operation, as well as to a method of adjusting internal power supply potential of the semiconductor device.

2. Description of the Background Art

In recent semiconductor memory device, in order to prevent lowering of breakdown voltage caused by miniaturization of the elements, to suppress current consumption caused by larger capacity and to ensure compatibility with conventional semiconductor memory devices, an internal power supply circuit which lowers an external power supply potential extVcc to supply an internal power supply potential intVcc to the chip is provided.

FIG. 11 is a block diagram showing a structure of a conventional dynamic random access memory (herein after referred to as a DRAM) including the internal power supply circuit.

Referring to FIG. 11, the DRAM includes control signal input terminals 51–53, 57, an address signal input terminal group 54, a power supply terminal 55, a ground terminal 56 and a data signal input/output terminal group 58. Further, the DRAM includes a clock generating circuit 59, an address buffer 60, a row recorder 61, a column recorder 62, a memory array 63, a sense refresh amplifier+ input/output control circuit 64, an input buffer 65, an output buffer 66 and an internal power supply circuit 67.

Clock generating circuit 59 selects a prescribed operation based on signals /RAS, /CAS, /WE which are externally applied to control signal input terminals 51 to 53, and it controls the DRAM as a whole.

Address buffer 60 selectively applies address signals A0 to An which are applied externally through address signal input terminal group 54 to row recorder 61 and column recorder 62. Memory array 63 has a storage capacity of, for example, 16M bits. One bit data is stored in one memory cell. Each memory cell is arranged at a unique address determined by a column address and a row address.

In accordance with the address signal applied from address buffer 60, row recorder 61 designate a row address of memory array 63. In accordance with the address signal applied from address buffer 60, column recorder 62 designates a column address of memory array 63. Sense refresh amplifier+ input/output control circuit 64 connects the memory cell of the address designated by the row recorder 61 and column recorder 62 to one end of global signal input/output line pair GIO.

The other end of global signal input/output line pair GIO is connected to input buffer 65 and output buffer 66. In response to a signal /WE externally applied through control signal input terminal 53 at the time of writing, input buffer 65 applies data input from data signal input/output terminal group to the selected memories, through global signal input/ output line pair GIO. In response to a signal /OE input from control signal input terminal 57 at the time of reading operation, output buffer 66 outputs data read from the selected memory cell to data input/output terminal group 58.

To the power supply terminal 55 and the ground terminal 56, external power supply potential extVcc and the ground potential Vss are externally applied. Internal power supply circuit 67 lowers the external power supply potential extVcc, which is applied to external power supply line 70, and generates an internal power supply potential intVcc. Internal power supply potential intVcc and the ground potential Vss are supplied to the entire DRAM through internal power supply line 72 and ground line 71, respectively.

FIG. 12 is a block diagram showing a structure of internal power supply circuit 67. Referring to FIG. 12, internal power supply circuit 67 includes a level generating circuit 81, a level synthesizing circuit 86 and a drive circuit 87, and level generating circuit 81 includes constant current circuits 82 and 84, a $V_1$ generating circuit 83 and a $V_2$ generating 85.

As shown in FIG. 13, level generating circuit 81 includes output controllable constant current source 88 and variable resistance circuit 89 connected in series between external power supply line 70 and ground line 71 as well as a variable resistance circuit 90 and an output controllable constant current source 91 connected in series between external power supply line 70 and ground line 71. Constant current sources 88 and 91 constitute constant current circuits 82 and 85 shown in FIG. 12, respectively. Variable resistance circuits 89 and 90 constitute $V_1$ generating circuit 83 and $V_2$ generating circuit 84 of FIG. 12, respectively.

From a connection node N89 between constant current source 88 and variable resistance circuit 89, a first potential $V_1$ is output. When we represent the current value of constant current source 88 by $I_1$ and the resistance value of variable resistance circuit 89 by $R_1$, then it holds $V_1=I_1 \times R_1$. From a connection node N90 between variable resistance circuit 90 and constant current source 91, a second potential $V_2$ is output. When we represent the resistance value of variable resistance circuit 90 by $R_2$ and the current value of constant current source 91 by $I_2$, then it holds $V_2=extVcc-R_2 \times I_2$.

As shown in FIG. 14, variable resistance circuit 89 includes a plurality of serially connected (six in the figure) resistance elements 100 to 105, and fuses 110 to 114 respectively connected parallel to resistance elements 101 to 105. Resistance elements 100 to 105 have prescribed resistance values $R_{00}$ to $R_{05}$, respectively. Fuses 110 to 114 are blown by laser beam. When fuses 110 to 114 are not blown, resistance value $R_1$ of variable resistance circuit 89 is $R_{00}$. When fuse 110 is blown, for example, resistance value $R_1$ of variable resistance circuit 89 would be $R_{00}+R_{01}$. The same applies to variable resistance circuit 90. Similar variable resistance circuits are included in constant current sources 88, 91, and current values $I_1$ and $I_2$ of constant current sources 88 and 91 are adjusted by blowing of the fuses of variable resistance circuits included in the sources. Therefore, even when output potentials $V_1$ and $V_2$ of level generating circuit 81 deviate from the set value because of variation in manufacturing, $V_1$ and $V_2$ can be corrected to the set value, by adjusting the resistance values $R_1$, $R_2$ and the current values $I_1$, $I_2$.

Level synthesizing circuit 86 outputs the higher of $V_1$ and $V_2$ as a reference potential Vref to drive circuit 87. Drive circuit 87 compares the potential of output node 87a connected to internal power supply line 72 with the reference potential Vref, and controls the potential of output node 87a so that the potential at output node 87a is always kept at the reference potential Vref. Therefore, intVcc=Vref.

FIG. 15 shows a change in internal power supply potential intVcc with respect to the change in external power supply potential extVcc. While the external power supply potential extVcc is in a range lower than VE1, intVcc equals extVcc, and as the external power supply potential extVcc rises, internal power supply potential intVcc also rises. While the external power supply potential extVcc is in the range of from VE1 to VE2, internal power supply potential intVcc is kept at a constant potential $V_1$. While the external power supply potential extVcc is in the range higher than VE2, intVcc equals extVcc $-\Delta V_2$, and internal power supply potential intVcc is lower by a prescribed voltage from external power supply potential extVcc but rises together with the external power supply potential extVcc. Here, $\Delta V_2 = R_2 \times I_2$. The range of VE1≦extVcc≦VE2 is used for the normal operation of the DRAM, and within this range, even when external power supply potential extVcc fluctuates, internal power supply potential intVcc is constant, ensuring stable operation of the DRAM. Meanwhile, the internal power supply potential intVcc is adapted to rise together with the external power supply potential extVcc in a range where extVcc>VE2, in order to apply a high voltage to internal circuitry of the DRAM at the time of reliability test and operation margin test.

However, the conventional internal power supply circuit 68 of the DRAM covers from the following problems.

FIG. 16 shows a method of adjustment of internal power supply potential intVcc. Referring to FIG. 16, $V_T$ is a curve representing internal power supply potential intVcc when $V_1$ and $V_T$ are at the set values, and $V_{T1}$ is a curve representing internal power supply potential intVcc when $V_1$ and $V_2$ deviate from the set value because of variation in manufacturing. The method of correcting the deviated curve $V_{T1}$ to $V_T$ will be described.

First, internal power supply potential intVcc is measured at two points where extVcc=Va and Vb. Here, Va is a potential determined when internal power supply potential intVcc is $V_1$ and Vb is a potential determined when internal power supply potential intVcc is $V_2$. Then, $V_1$ is corrected by the difference voltage Δa between the measured value at extVcc=Va and the set value. Similarly, $V_2$ is corrected by difference potential Δb between the measured value at extVcc=Vb and the set value. Consequently, internal power supply potential intVcc having the characteristic of $V_T$ can be obtained.

However, when $V_1$ becomes lower than the set value and $V_2$ becomes higher than that set value and the ideal curve $V_T$ and the actual curve $V_{T2}$ cross at the point where extVcc=Va as shown in FIG. 17, adjustment is not possible by the above described method. More specifically, where extVcc=Va, the difference voltage Δa between the measured value of internal power supply potential intVcc and the set value is 0, and it is determined that correction of $V_1$ is not necessary. Meanwhile, where extVcc=Vb, the measured value of internal power supply potential intVcc becomes higher by Δb than the set value, and hence adjustment is carried out to lower $V_2$ by Δb. As a result, the corrected curve $V_{T2}'$ does not coincide with the ideal curve $V_T$.

It is the same in the example of FIG. 18 in which $V_1$ becomes higher than the set value and $V_2$ becomes lower than the set value, and the ideal curve $V_T$ and the actual curve $V_{T3}$ cross at the point extVcc=Vb. The corrected curve $V_{T3}'$ does not coincide with the ideal curve $V_T$. It is not possible to repair the once blown fuse to re-adjust the internal power supply potential intVcc, and therefore the DRAM is discarded as defective.

SUMMARY OF THE INVENTION

Therefore, an object of the present invention is to provide a semiconductor memory device which can prevent failure in adjusting the internal power supply potential.

The semiconductor memory device of the present invention includes an inactivating circuit for inactivating, when output adjustment of one of first and second potential generating circuits is to be performed, the other one. Therefore, the first potential and second potential can be adjusted independent from each other when the internal power supply potentials are adjusted, and therefore, failure of adjustment of internal power supply potentials caused by confusion between the first and second potentials in the prior art can be prevented.

Preferably, the first potential generating circuit includes a first constant current circuit and a first variable resistance circuit connected in series, and the second potential generating circuit includes a second variable resistance circuit and a second constant current circuit connected in series. Therefore, the first and second potential generating circuits can be easily formed.

Preferably, each of the first constant current circuit, the first variable resistance circuit, the second variable resistance circuit and the second constant current circuit includes a plurality of resistance elements connected in series and fuses connected parallel to the resistance elements respectively, and adjustment of these circuits is performed by blowing off fuses. Therefore, each circuit can be adjusted easily and surely.

Preferably, each resistance elements is formed of a first transistor having a prescribed conductive resistance value. Therefore, the resistance element can be easily provided.

Preferably, the first and second constant current circuits share at least a plural sets of resistance elements and fuses. Therefore, circuit area can be reduced.

Preferably, the potential synthesizing circuit outputs a first potential when the external power supply potential is within a prescribed range, and outputs a second potential when the external power supply potential is higher than an upper limit of the prescribed range. Therefore, when the external power supply potential is within a prescribed range, a constant internal power supply potential for normal operation is obtained, and when the external power supply potential is higher than the upper limit of the prescribed range, an internal power supply potential for testing breakdown voltage, which rises together with the external power supply potential, can be obtained.

Preferably, the inactivating circuit includes a second transistor for disconnecting the first constant current circuit from the first variable resistance circuit, a third transistor for short-circuiting terminals of the first variable resistance circuit, a fourth transistor for disconnecting the second variable resistance circuit from the second constant current circuit, and a fifth transistor for short-circuiting terminals of the second constant current circuit. Therefore, the inactivating circuit can be formed easily.

A test circuit for simulating, before blowing off a fuse, the first and second potentials after blowing the fuse is provided. Therefore, failure in blowing the fuse can be prevented.

Preferably, the test circuit includes a testing resistance elements and a fifth transistor connected in parallel. Therefore, the test circuit can be formed easily.

Preferably, a signal generating circuit responsive to an externally applied signal for applying a control signal to an input electrode of the first to fifth transistors is provided.

Therefore, the inactivating circuit and the test circuit can be controlled easily.

In the method of adjusting internal power supply potential of the semiconductor memory device in accordance with the present invention, when output adjustment of one of the first and second potential generating circuits is performed, the other one is inactivated, and hence the first and second potentials can be adjusted completely independent from each other when the internal power completely potential is adjusted. Therefore, unlike the prior art, failure of the adjustment of the internal power supply potential by confusing the first and second potentials can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (Embodiment 1)

Figure 1:
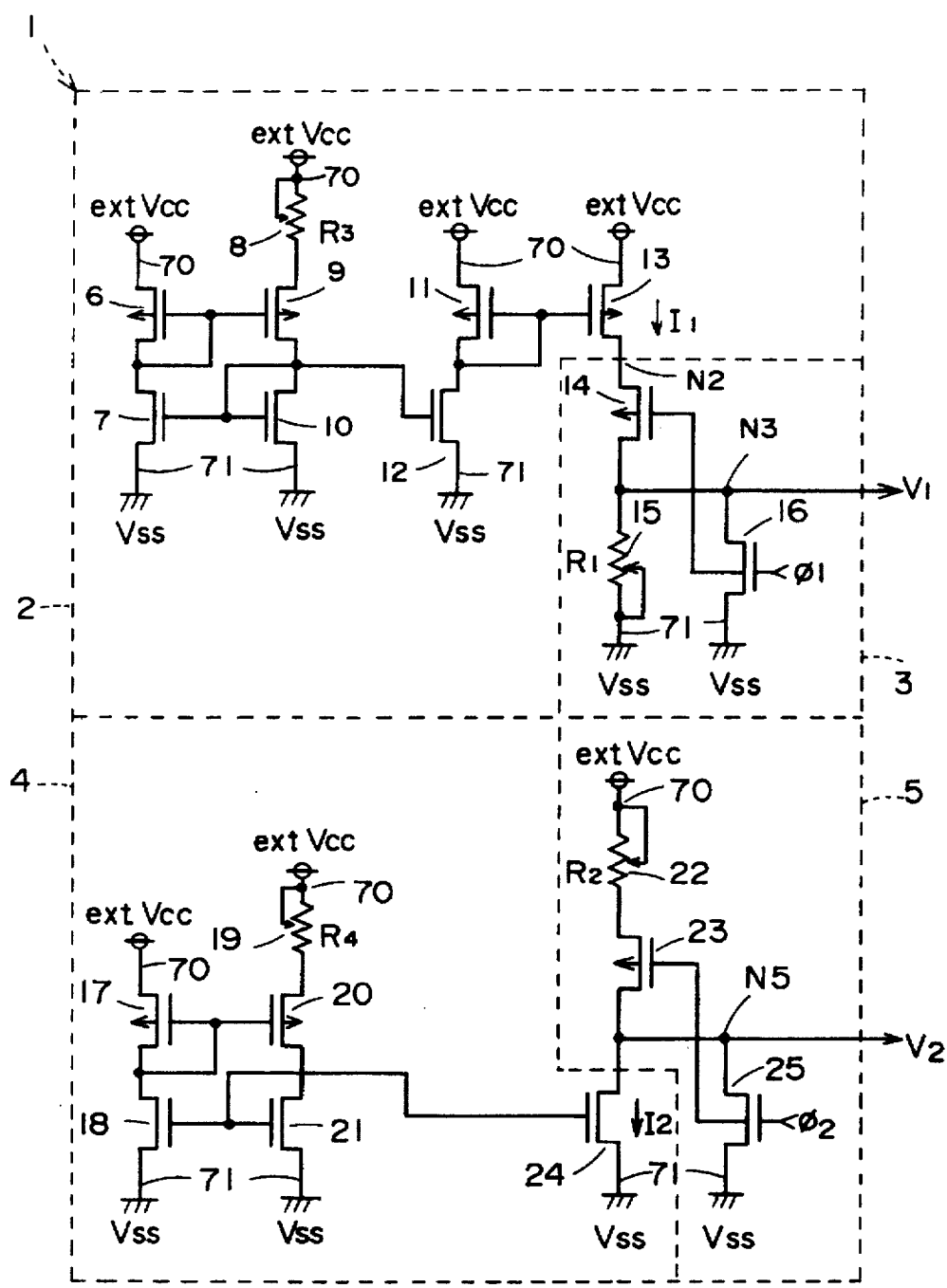
FIG. 1 is a schematic diagram showing a structure of a level generating circuit in an internal power supply circuit of a DRAM in accordance with Embodiment 1 of the present invention.

FIG. 1 is a schematic diagram showing a structure of level generating circuit 1 of an internal power supply circuit of a DRAM in accordance with Embodiment 1 of the present invention.

Referring to FIG. 1, the level generating circuit 1 is similar to the conventional level generating circuit 81 in that it generates $V_1=I_1 \times R_1$, $V_2=\text{extVcc}-I_2 \times R_2$, and that $V_1$ and $V_2$ can be adjusted by adjusting current values $I_1$, $I_2$ and resistance values $R_1$ and $R_2$. Level generating circuit 1 differs from the level generating circuit 81 in that transistors 14, 16, 23 and 25 are newly provided for inactivating $V_1$ generating circuit 3 or $V_2$ generating circuit 5 when $V_1$, $V_2$ is to be adjusted, and for fixing $V_1$ or $V_2$ to the ground potential $Vss=0V$.

Figure 12:
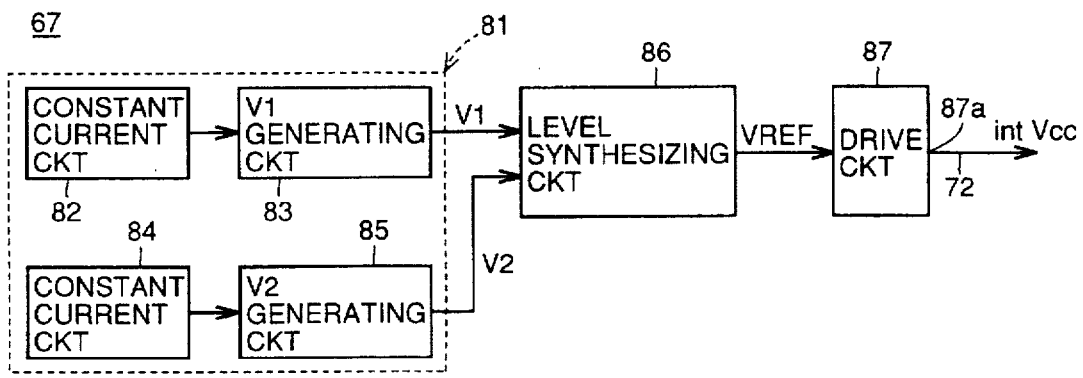
FIG. 12 is a block diagram showing a structure of an internal power supply circuit of the DRAM shown in FIG. 11.
Figure 13:
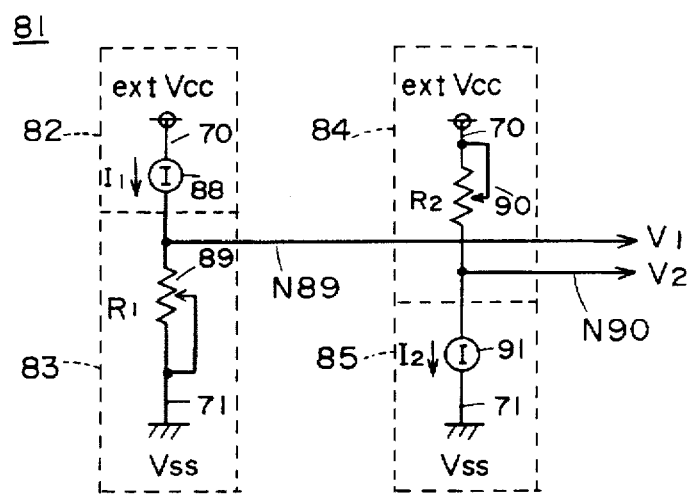
FIG. 13 is a schematic diagram showing a structure of a level generating circuit of the internal power supply circuit shown in FIG. 12.
Figure 14:
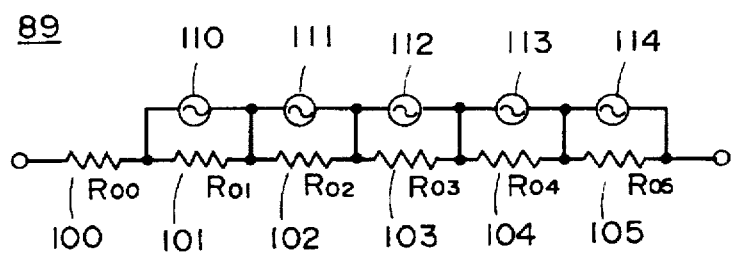
FIG. 14 is a schematic diagram showing a structure of a variable resistance circuit shown in FIG. 13.

More specifically, the level generating circuit 1 includes constant current circuits 2 and 4, a $V_1$ generating circuit 3 and a $V_2$ generating circuit 5. Constant current circuit 2 includes P channel MOS transistors 6, 9, 11 and 13, N channel MOS transistors 7, 10, 12, and a variable resistance circuit 8. The variable resistance circuit 8 has a similar structure as variable resistance circuit 89 shown in FIG. 12, and resistance value $R_3$ of variable resistance circuit 8 can be adjusted by blowing fuses 110 to 114.

P channel MOS transistor 6 and N channel MOS transistor 7, variable resistance circuit 8, P channel MOS transistor 9 and N channel MOS transistor 10, and P channel MOS transistor 11 and N channel MOS transistor 12 are connected in series between external power supply line 70 and ground line 71, respectively. P channel MOS transistor 13 is connected between external power supply line 70 and an output node N2 of constant current circuit 2. P channel MOS transistors 6 and 9 have their gates connected together to the drain of P channel MOS transistor 6. N channel MOS transistors 7, 10 and 12 are all connected (with their gates) to the drain of N channel MOS transistor 10. P channel MOS transistors 11 and 13 have their gates connected together to the drain of P channel MOS transistor 11. More specifically, P channel MOS transistors 6 and 9, N channel MOS transistors 7, 10 and 12, and P channel MOS transistors 11 and 13 constitute current mirror circuits respectively. Therefore, when it is assumed that sizes of MOS transistors 6, 7, 9 to 13 are all the same, the current of the same value $I_1$ flows through each of the MOS transistors 6, 7, 9 to 13. Therefore, in P channel MOS transistor 13, a current of a value $I_1$ in reverse proportion to the resistance value $R_3$ of variable resistance circuit 8 flows. Current value $I_1$ can be adjusted by blowing fuses 110 to 114 of a variable resistance circuit 8.

$V_1$ generating circuit 3 includes a P channel MOS transistor 14 and a variable resistance circuit 15 connected in series between the output node N2 of constant current circuit 2 and ground line 71 and an N channel MOS transistor 16 connected parallel to the variable resistance circuit 15. To the gates of P channel MOS transistor 14 and N channel MOS transistor 16, a test mode signal $\phi_1$ is externally applied through a pad, which is not shown. Variable resistance circuit 15 has a similar structure as variable resistance circuit 89 shown in FIG. 12, and resistance value $R_1$ of variable resistance circuit 15 can be adjusted by blowing fuses 110 to 114.

When test mode signal $\phi_1$ is at the inactive level of "L", P channel MOS transistor 14 is rendered conductive, N channel MOS transistor 16 is rendered non-conductive, and $V_1=R_1 \times I_1$ is output from connection node N3 between P channel MOS transistor 14 and variable resistance circuit 15. When test mode signal $\phi_1$ is at the active level of "H", P channel MOS transistor 14 is rendered non-conductive, N channel MOS transistor 16 is rendered conductive, and $V_1$ attains $V_1=0V$.

Constant current circuit 4 includes P channel MOS transistors 17 and 20, N channel MOS transistors 18, 21 and 24, and a variable resistance circuit 19. Variable resistance circuit 19 has the same structure as variable resistance circuit 89 shown in FIG. 12, and resistance value $R_4$ of variable resistance circuit 19 can be adjusted by blowing fuses 110 to 114.

P channel MOS transistor 17 and N channel MOS transistor 18, variable resistance circuit 19, P channel MOS transistor 20 and N channel MOS transistor 21 are connected in series between the external power supply line 70 and ground line 71, respectively. N channel MOS transistor 24 is connected between output node N5 of $V_2$ generating circuit 5 and ground line 71. P channel MOS transistors 17 and 20 have their gates connected together to the drain of P channel MOS transistor 17. N channel MOS transistors 18, and 24 are all connected (with their gates) to the drain of N channel MOS transistor 21. More specifically, P channel MOS transistors 17 and 20 and N channel MOS transistors 18, 21 and 24 constitute current mirror circuits respectively. Therefore, if MOS transistors 17, 18, 20, 21 and 24 have the same transistor size, thus current of the same value $I_2$ flows through each of MOS transistors 17, 18, 20, 21 and 24. Therefore, in N channel MOS transistor 24, a current of the value $I_2$ which is in reverse proportion to resistance value $R_4$ of variable resistance circuit 19 flows. Current value $I_2$ can be adjusted by blowing fuses 110 to 114 of variable resistance circuit 19.

$V_2$ generating circuit 5 includes a variable resistance circuit 22 and a P channel MOS transistor 23 connected in series between external power supply line 70 and output node N5, and an n channel MOS transistor 25 connected parallel to N channel MOS transistor 24 of constant current circuit 4. To the gates of P channel MOS transistor 23 and N channel MOS transistor 25, a test mode signal $\phi_2$ is externally applied through a pad which is not shown. Variable resistance circuit 22 has similar structure as variable resistance circuit 89 shown in FIG. 12, and resistance value $R_2$ of variable resistance circuit 22 can be adjusted by blowing fuses 110 to 114.

When test mode signal $\phi_2$ is at the inactive level of "L", P channel MOS transistor 23 is rendered conductive, N channel MOS transistor 25 is rendered non-conductive, and $V_2=extVcc-R_2\times I_2$ is output from output node N5. When test mode signal $\phi_2$ is at the active level of "H", P channel MOS transistor 23 is rendered non-conductive, N channel MOS transistor 25 is rendered conductive, and $V_2$ would be $V_2=0V$.

Figure 2:
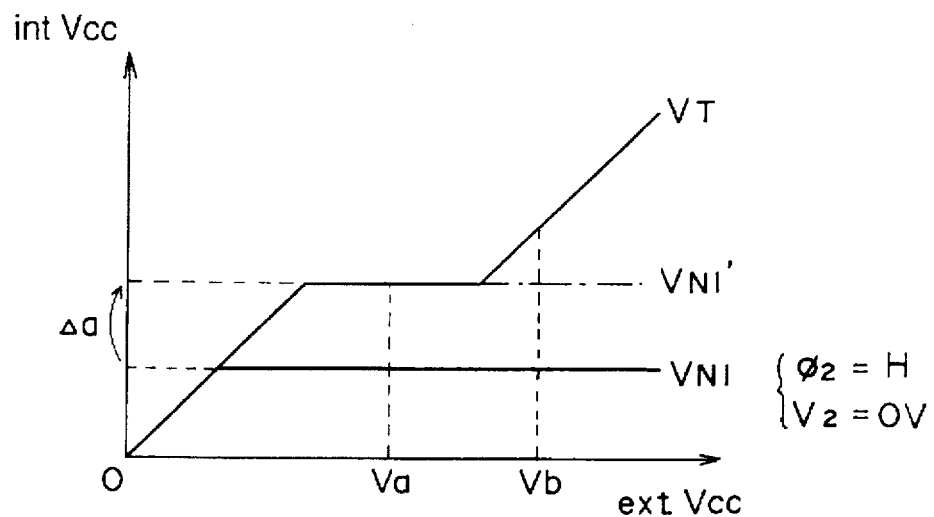
FIG. 2 shows a method of adjusting $V_1$ of the level generating circuit shown in FIG. 1.
Figure 3:
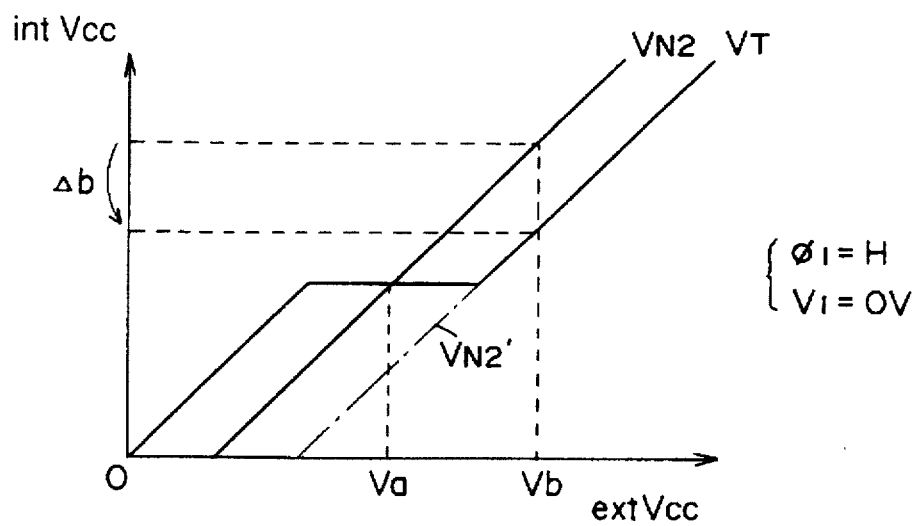
FIG. 3 shows a method of adjusting $V_2$ of the level generating circuit shown in FIG. 1.
Figure 15:
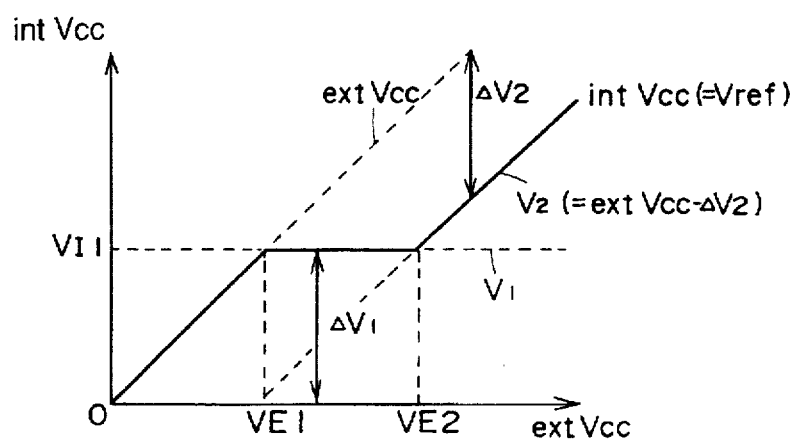
FIG. 15 shows output characteristic of the internal power supply circuit shown in FIG. 12.
Figure 16:
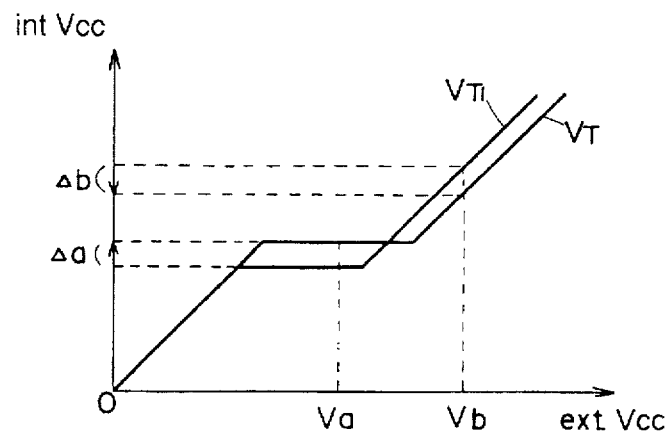
FIG. 16 shows a method of adjustment of the internal power supply circuit shown in FIG. 12.
Figure 17:
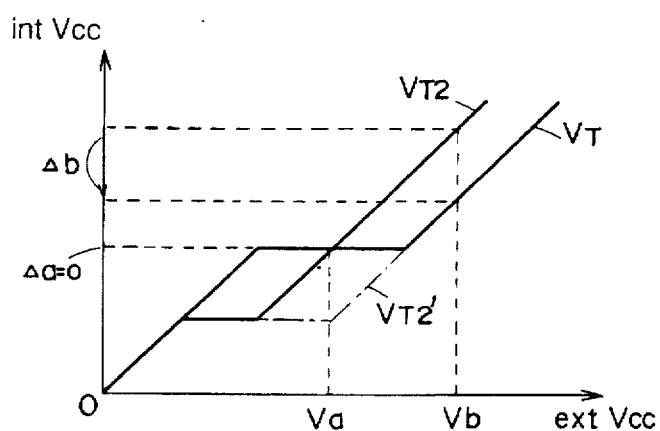
FIG. 17 shows problems of the internal power supply circuit shown in FIG. 12.
Figure 18:
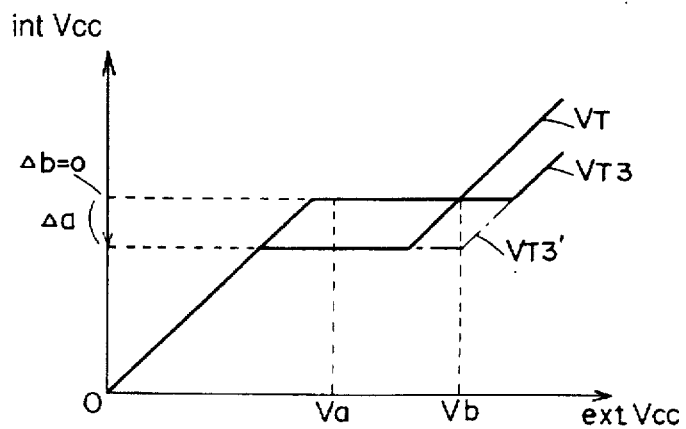
FIG. 18 is another illustration showing problems of the internal power supply circuit shown in FIG. 12.

FIGS. 2 and 3 show a method of adjusting internal power supply potential intVcc. Here, an example which could not be adjusted in accordance with the prior art described with reference to FIG. 15 will be discussed as an example. Referring to FIGS. 2 and 3, $V_T$ is the ideal curve showing the internal power supply potential intVcc when $V_1$ and $V_2$ are at the set value, $V_{N1}$ is a curve before adjustment showing internal power supply potential intVcc when $V_1$ is smaller by $\Delta a$ than the set value and $V2=0$, $V_{N1}'$ is a curve after adjustment showing internal power supply potential intVcc when $V_1$ is at the set value and $V_2=0V$, $V_{N2}$ is a curve before adjustment showing internal power supply potential intVcc when $V_2$ is larger by $\Delta b$ than the set value and $V_1=0V$, and $V_{N2}'$ is a curve adjustment showing the internal power supply potential intVcc when $V_2$ is at the set value and $V_1=0V$.

First, test mode signal $\phi 1$ is set to the "L" level, test mode signal $\phi_2$ is set to the "H" level so that $V_2=0V$, and internal power supply potential intVcc is measured at a point where extVcc=Va. At this time, since $V_2=0V$, it holds that intVcc=$V_1$. Thereafter, difference voltage $\Delta a$ between the set value of $V_1$ and the measured value of intVcc=$V_1$ at the point where extVcc=Va is calculated, and resistance values $R_3$ and $R_1$ of variable resistance circuits 8 and 15 are adjusted, whereby $V_1$ is raised by difference voltage $\Delta a$. Consequently, the curve $V_{N1}$ of FIG. 2 can be corrected to the line of $V_{N1}'$.

Thereafter, test mode signal $\phi_1$ is set to "H" level, test mode signal $\phi_2$ is set to the "L" level so that $V_1=0V$, and internal power supply potential intVcc where extVcc=Vb is measured. At this time, since $V_1=0V$, it holds that intVcc=$V_2$. Thereafter, difference voltage $\Delta b$ between the measured value of intVcc=$V_2$ and the set value of $V_2$ at the point where extVcc=Vb is calculated, resistance values $R_4$ and $R_2$ of variable resistance circuits 19 and 22 are adjusted and thus $V_2$ is lowered by the difference voltage $\Delta b$. Thus the line $V_{N2}$ of FIG. 3 can be corrected to the curve $V_{N2}'$.

In the normal mode, test mode signals $\Delta_1$ and $\Delta_2$ are both fixed at the "L" level. At this time, the curve representing internal power supply potential intVcc would be the curve obtained by synthesizing curves $V_{N1}'$ and $V_{N2}'$, the resulting curve coinciding the ideal curve $V_T$.

In this embodiment, when $V_1$ is to be adjusted, $V_2$ is set to 0V, and when $V_2$ is to be adjusted, $V_1$ is set to 0V. Therefore, unlike the prior art in which $V_1$ and $V_2$ are confused in adjusting the internal power supply potential intVcc, failure in adjusting internal power supply potential intVcc can be prevented.

(Embodiment 2)

Figure 4:
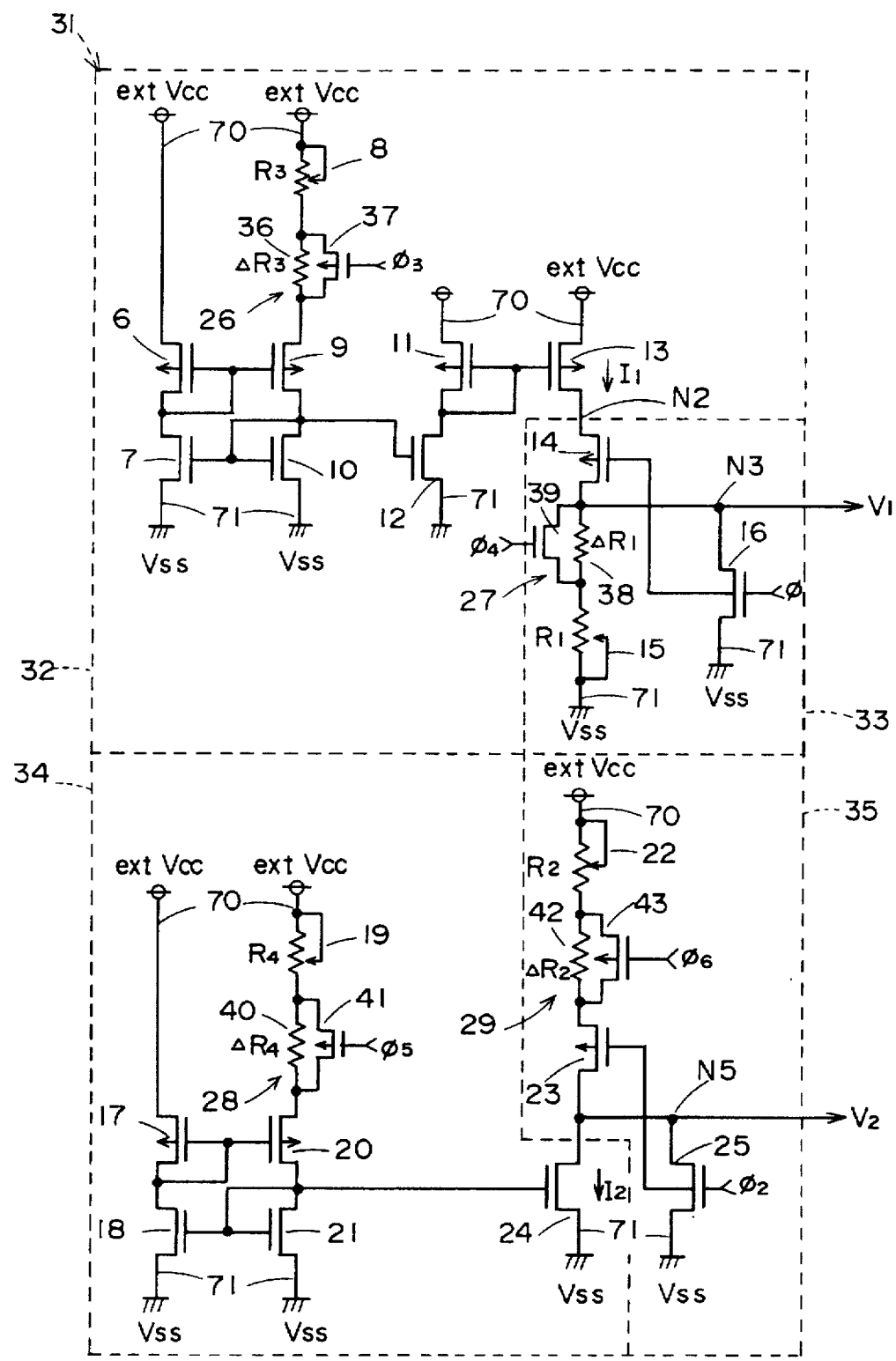
FIG. 4 is a schematic diagram showing a structure of a level generating circuit of an internal power supply circuit of the DRAM in accordance with Embodiment 2 of the present invention.

FIG. 4 shows a structure of a level generating circuit 31 of an internal power supply circuit of a DRAM in accordance with Embodiment 2 of the present invention.

Referring to FIG. 4, level generating circuit 31 includes a constant current circuit 32, a $V_1$ generating circuit 33, a constant current circuit 34 and a $V_2$ generating circuit 35. Constant current circuit 32, $V_2$ is generating circuit 33, constant current circuit 34 and $V_1$ generating circuit 35 of the level generating circuit 31 differ from constant current circuit 2, $V_1$ generating circuit 3, constant current circuit 4 and $V_2$ generating circuit 5 of level generating circuit 1 shown in FIG. 1 in that test circuits 26, 27, 28 and 29 are newly provided respectively. Test circuits 26 to 29 are provided for simulating the states of the fuses 110 to 114 after blowing off in the variable resistance circuits 8, 15, 19 and 22, respectively.

Test circuit 26 includes a resistance element 36 connected between variable resistance circuit 8 and P channel MOS transistor 9, and a P channel MOS transistor 37 connected parallel to resistance element 36. P channel MOS transistor 37 receives at its gate the test mode signal $\phi_3$.

Test circuit 27 includes a resistance element 38 connected between an output node N3 of $V_1$ generating circuit 33 and variable resistance circuit 15, and an N channel MOS transistor 39 connected parallel to resistance element 38. N channel MOS transistor 39 receives at its gate the test mode signal $\phi_4$.

Test circuit 28 includes a resistance element 40 connected between variable resistance circuit 19 and P channel MOS transistor 20, and a P channel MOS transistor 41 connected parallel to resistance element 40. P channel MOS transistor 41 receives at its gate a test mode signal $\phi_5$.

Test circuit 29 includes a resistance element 42 connected between variable resistance circuit 22 and P channel MOS transistor 23, and a P channel MOS transistor 43 connected parallel to resistance element 42. P channel MOS transistor 43 receives at its gate a test mode signal $\phi_6$.

Test mode signals $\phi_3$ to $\phi_6$ are externally input through pads, which are not shown, in the similar manner as test modes $\phi_1$ and $\phi_2$.

In the normal mode, test mode signals $\phi_3$, $\phi_4$, $\phi_5$ and $\phi_6$ are at "L" level, "H" level, "L" level and "L" level respectively, and MOS transistors 37, 39, 41 and 43 are all conductive. In the test mode, when the states after blowing of fuses 110 to 114 are to be simulated in the test mode, test mode signals $\phi_3$, $\phi_4$, $\phi_5$ and $\phi_6$ are respectively set to "H" level, "L" level, "H" level and "H" level, so that MOS transistors 37, 39, 41 and 43 are rendered non-conductive respectively. By doing so, the same state as when the resistance values $R_3$, $R_1$, $R_4$ and $R_2$ of variable resistance circuits 8, 15, 19 and 22 are increased to $R_3+\Delta R_3$, $R_1+\Delta R_1$, $R_4+\Delta R_4$ and $R_2+\Delta R_2$ can be provided. Here, $\phi R_3$, $\phi R_1$, $\phi R_4$ and $\phi R_2$ are resistance values of resistance elements 36, 38, 40 and 42.

Figure 5:
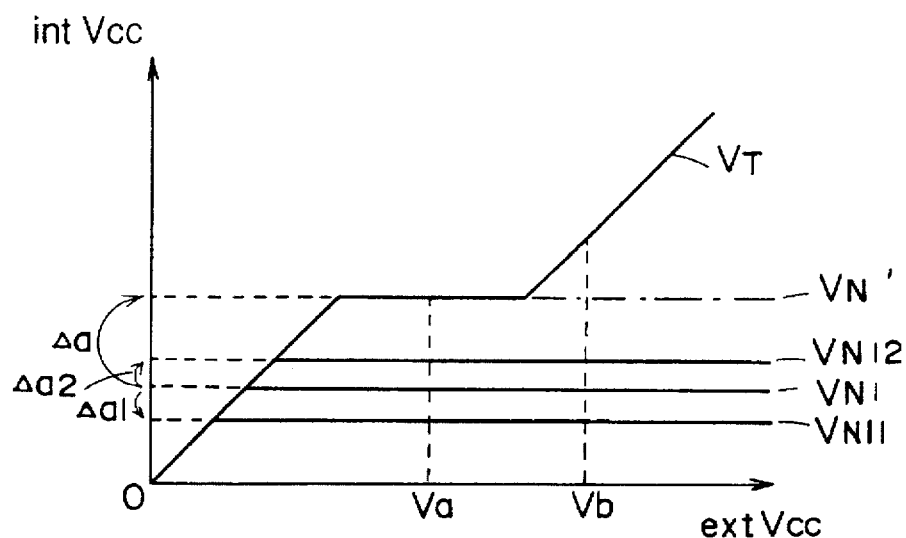
FIG. 5 shows a method of adjusting $V_1$ of the level generating circuit shown in FIG. 4.
Figure 6:
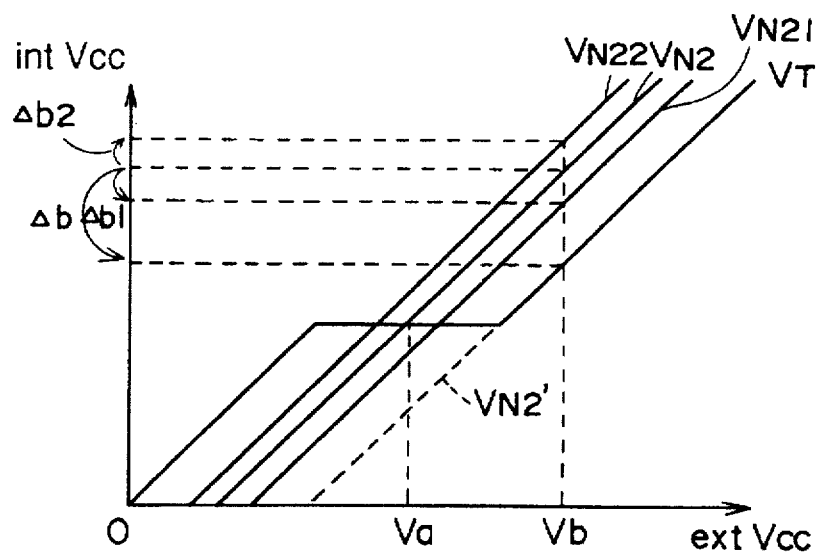
FIG. 6 shows a method of adjusting $V_2$ of the level generating circuit shown in FIG. 4.

FIGS. 5 and 6 show a method of adjusting internal power supply potential intVcc. Here, as in FIGS. 2 and 3, the example in which $V_1$ is lower than the set value and $V_2$ is higher than the set value will be described.

In FIGS. 5 and 6, $V_T$ is the ideal curve showing internal power supply potential intVcc when $V_1$ and $V_2$ are at the set value, $V_{N1}$ and $V_{N2}$ are curves before the adjustment and $V_{N1}'$ and $V_{N2}'$ are curves after the adjustment.

First, in the similar manner as in Embodiment 1, the difference voltage $\Delta a$ between the set value of $V_1$ and the measured value at the point where extVcc=Va is calculated. Thereafter, test mode signal $\phi_3$ is set to the "H" level so that P channel MOS transistor 37 is rendered non-conductive. Consequently, series resistance value of variable resistance circuit 8 and test circuit 26 increases from $R_3$ to $R_3+\phi R_3$, current value $I_1$ reduces and $V_1$ lowers. The characteristic part of internal power supply potential intVcc at this time corresponds to $V_{N11}$ of FIG. 5. The internal power supply potential intVcc=$V_1$ at the point where extVcc=Va is measured, and the difference voltage $\Delta a_1$ of $V_1$ before and after the test mode signal $\phi_3$ is set to "H" level is calculated. More specifically, the change $\Delta a_1$ of $V_1$ with respect to the change $\Delta R_3$ of the resistance value of constant current circuit 32 is actually measured.

Thereafter, test mode signal $\phi_3$ is recovered to the "L" level, and test mode signal $\phi_4$ is set to "L" level. Consequently, series resistance value of variable resistance circuit 15 and test circuit 27 increases from $R_1$ to $R_1+\Delta R_1$, and $V_1$ rises. The characteristic curve of internal power supply potential intVcc at this time corresponds to $V_{N12}$ of FIG. 5. At this state, internal power potential intVcc =$V_1$ is measured at a point where extVcc=Va, and difference voltage $\Delta a_2$ before and after the test mode signal $\phi_4$ is set to the "H" level is calculated. In other words, the change $\Delta a_2$ of $V_1$ with respect to the change $\Delta R_1$ of the resistance value of $V_2$ generating circuit 33 is actually measured. It is possible to correct the deviation of $V_1$ from the set value, based on the two values $\Delta a_1$ and $\Delta a_2$. FIG. 5 shows an example in which the measured value is lower than the set value of $V_1$. In that case, by increasing resistance value $R_1$ of $V_1$ generating circuit 33, $V_1$ can be corrected. The necessary value of correction of the resistance in this case is represented as $(\Delta a/\Delta a_2)\times \Delta R_1$. Conversely, if the measured value of $V_1$ is higher than the set value, resistance value $R_3$ of constant current circuit 32 is increased and current $I_1$ is reduced so that $V_1$ is lowered to be equal to the set value. The necessary value of correction of the resistance in this case is represented as $(\Delta a/\Delta a_1)\times \Delta R_3$.

The method of adjusting $V_2$ will be described. First, in the similar manner as Embodiment 1, difference voltage $\Delta b$ between the set value and the measured value of $V_2$ at the point where ExtVcc =Va is calculated. Thereafter, test mode signal $\phi_6$ is set to the "H" level so that P channel MOS transistor 43 is rendered non-conductive. Consequently, series resistance value of variable resistance circuit 22 and test circuit 29 increases from $R_2$ to $R_2+\Delta R_2$, and $V_2$ lowers from extVcc–$I_2\times R_2$ to extVcc–$(R_2+\Delta R_2)$. Characteristic curve of the internal power supply potential IntVcc at this time corresponds to $V_{N21}$ of FIG. 6. At this state, the internal power supply potential intVcc=$V_2$ at the point where extVcc=Vb is measured, and difference voltage $\Delta b1$ of $V_2$ before and after the test mode signal $\phi_6$ is set to the "H" level is calculated. In other words, the change $\Delta b_1$ of $V_2$ with respect to the change $\Delta R_2$ of the resistance value of $V_2$ generating circuit 35 is actually measured.

Thereafter, test mode signal $\phi_6$ is returned to the "L" level, and test mode signal $\phi_5$ is set to the "H" level. Consequently, series resistance value of variable resistance circuit 19 and test circuit 28 increases form $R_4$ to $R_4+\Delta R_4$, current value of $I_2$ reduces and $V_2$ increases. The characteristic curve of internal power supply potential intVcc at this time corresponds to $V_{N22}$. At this state, internal power supply potential intVcc=$V_2$ at the point where extVcc=Vb is measured, and difference voltage $\Delta b_2$ before and after the test mode signal $\phi_5$ is set to the "H" level is calculated. In other words, the change $\Delta b_2$ of $V_2$ with respect to the change $\Delta R_4$ of the resistance value of the constant current circuit 34 is actually measured.

Based on the two values $\Delta b_1$ and $\Delta b_2$, the necessary value of correction of the resistance is calculated. When the measured value of $V_2$ is higher than the set value, the resistance value $R_2$ of $V_2$ generating circuit 35 is increased and $V_2$ is lowered. Correction value of the resistance at this time is $(\Delta b/\Delta b_1)\times \Delta R_2$. Meanwhile, if the measured value of $V_2$ is lower than the set value, resistance value $R_4$ of constant current circuit 34 is increased, a current value $I_2$ is reduced and $V_2$ is increased. The correction value at this time is $(\Delta b/\Delta B_2)\times \Delta R_4$.

In this embodiment, states of the variable resistance circuits 8, 10, 19 and 22 after fuses 110 to 114 are blown can be simulated by test circuits 26 to 29, and hence adjustment of the internal power supply potential intVcc can be surely carried out without any failure.

Figure 7:
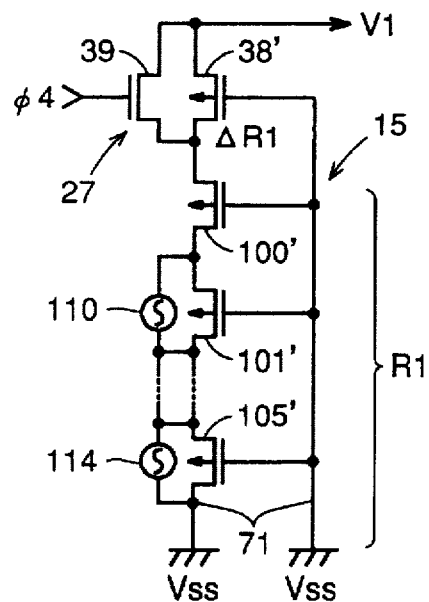
FIG. 7 is a schematic diagram showing an improved example of the level generating circuit shown in FIG. 4.
Figure 8:
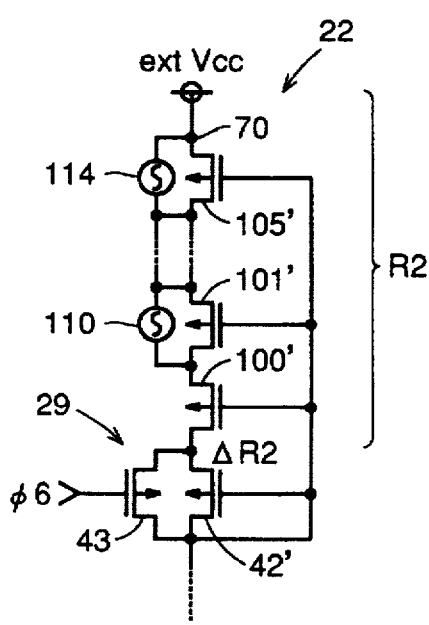
FIG. 8 is a schematic diagram showing an improved example of the level generating circuit shown in FIG. 4.

Each of the resistance elements 36, 38, 40 and 42 included in test circuits 26, 27, 28 and 29 and each of the resistance elements 100 to 105 included in variable resistance circuits 8, 15, 19, 22 respectively may have arbitrary structure. However, as shown in FIGS. 7 and 8, it is formed by a P channel MOS transistor having a prescribed conduction resistance value, for example. The gate of each P channel MOS transistor is connected to a node of which potential is lower than that of the source. For example, the gate of P channel MOS transistor 38' constituting the resistance element 38 of test circuit 27 and the gate of each of the P channel MOS transistors 100' to 105' constituting resistance elements 100 to 105 of variable resistance circuit 15 are commonly connected to ground line 71. The gate of P channel MOS transistor 42' constituting the resistance element 42 of test circuit 29 and the gate of each of the P channel MOS transistors 100' to 105' constituting the resistance elements 100 to 105 of variable resistance circuits 22 are commonly connected to the drain of P channel MOS transistor 43.

[Embodiment 3]

Figure 9:
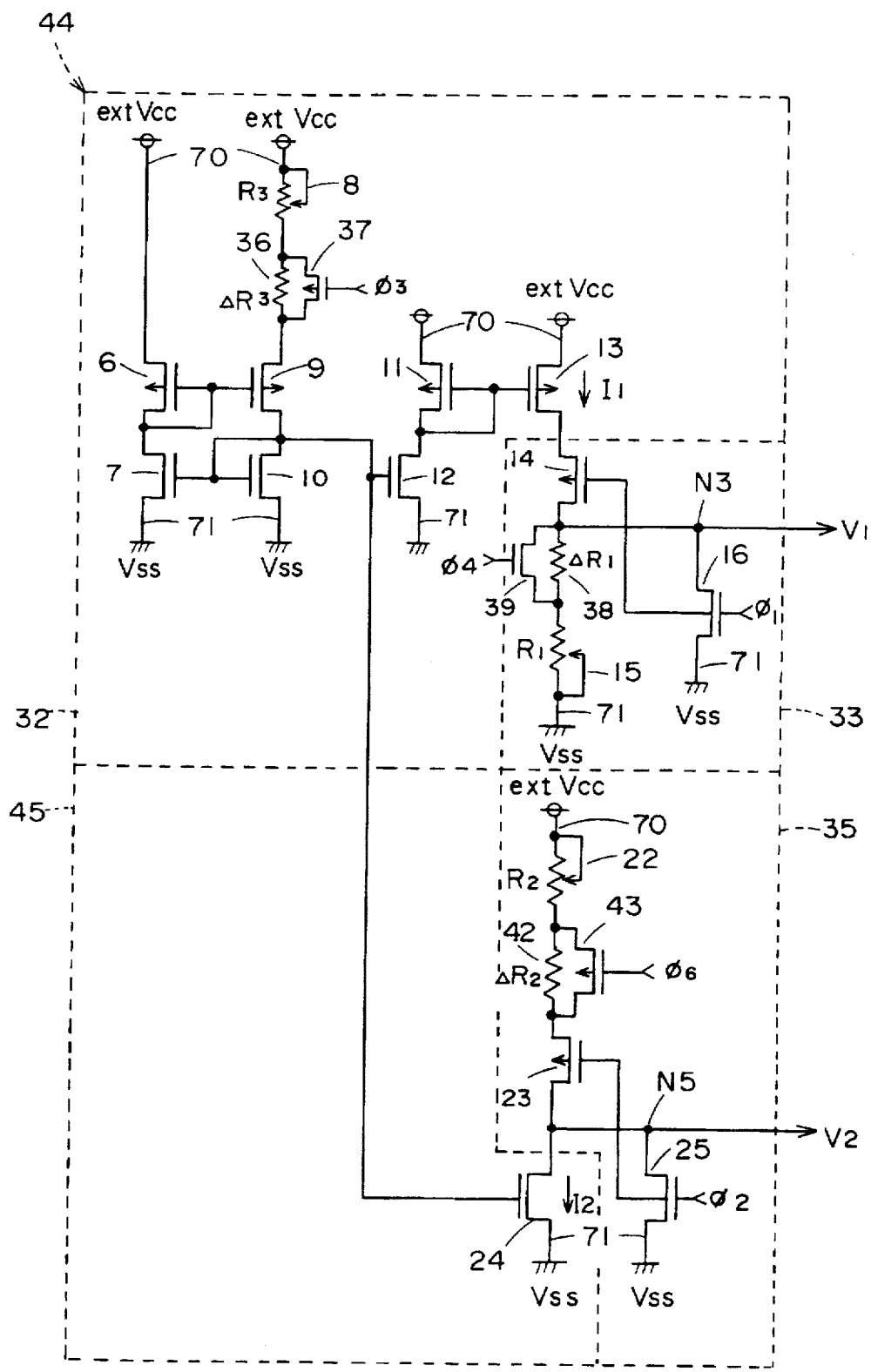
FIG. 9 is a schematic diagram showing a structure of a level generating circuit of an internal power supply circuit of the DRAM in accordance with Embodiment 3 of the present invention.

FIG. 9 is a schematic diagram showing a structure of a level generating circuit 44 of an internal power supply circuit in a DRAM in accordance with Embodiment 3 of the present invention. Level generating circuit 44 differs from level generating circuit 31 shown in FIG. 4 in that P channel MOS transistors 17 and 20, N channel MOS transistor 18 and 21, variable resistance circuit 19 and 5 test circuit 28 of constant current circuit 34 are removed, and N channel MOS transistor 24 has its gate connected to gates of N channel MOS transistors 7, 10 and 12 of constant current circuit 32. More specifically, P channel MOS transistors 6 and 9, N channel MOS transistors 7 and 10, variable resistance circuit 8 and test circuit 26 are shared by two constant current circuits 32 and 45.

In the level generating circuit 44, there is only a variable resistance circuit 8 for adjusting current values $I_1$ and $I_2$. Therefore, adjustment is performed by referring to larger one of reference voltages $\Delta a$ and $\Delta b$ between the measured value and the set value of $V_1$ and $V_2$, for example, referring to $V_1$. Therefore, $V_2$ is excessively corrected. The excess is corrected by adjusting resistance value $R_2$ of $V_2$ generating circuit 35.

In this embodiment, in addition to the similar effects as obtained by Embodiment 2, current consumption can be reduced and chip area can be reduced, since variable resistance circuit 8 and so on are shared by two constant current circuits 32 and 45.

[Embodiment 4]

Figure 10:
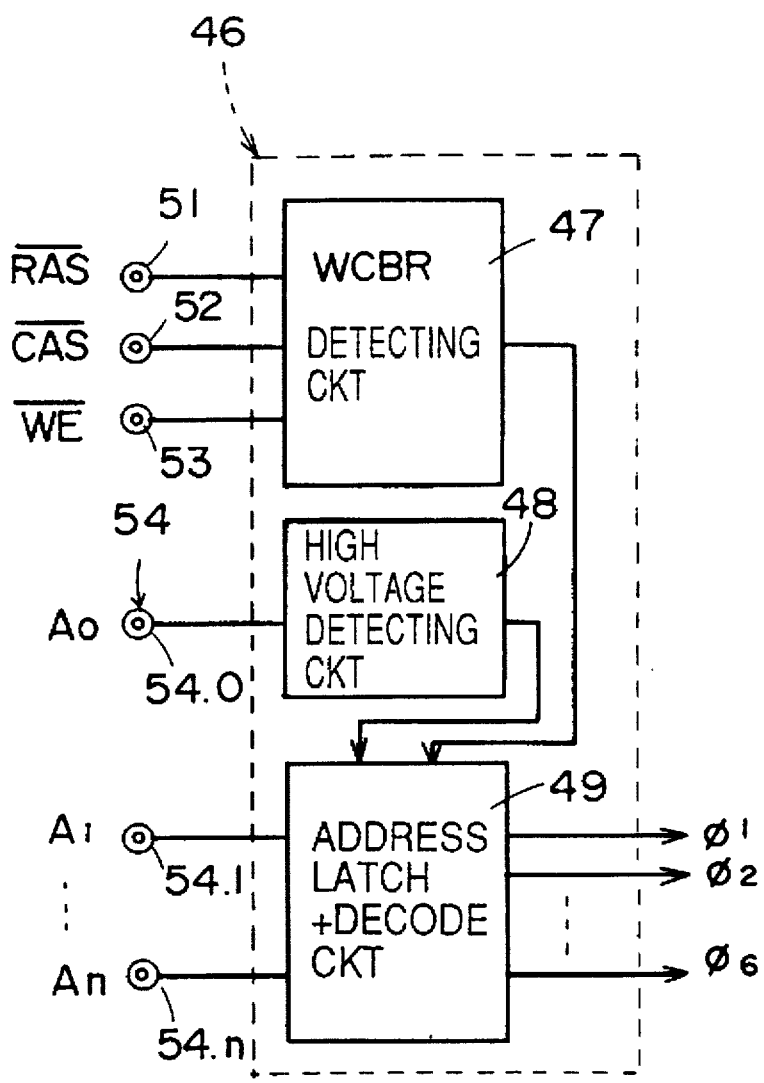
FIG. 10 is a block diagram showing a structure of a test mode signal generating circuit of the DRAM in accordance with Embodiment 4 of the present invention.
Figure 11:
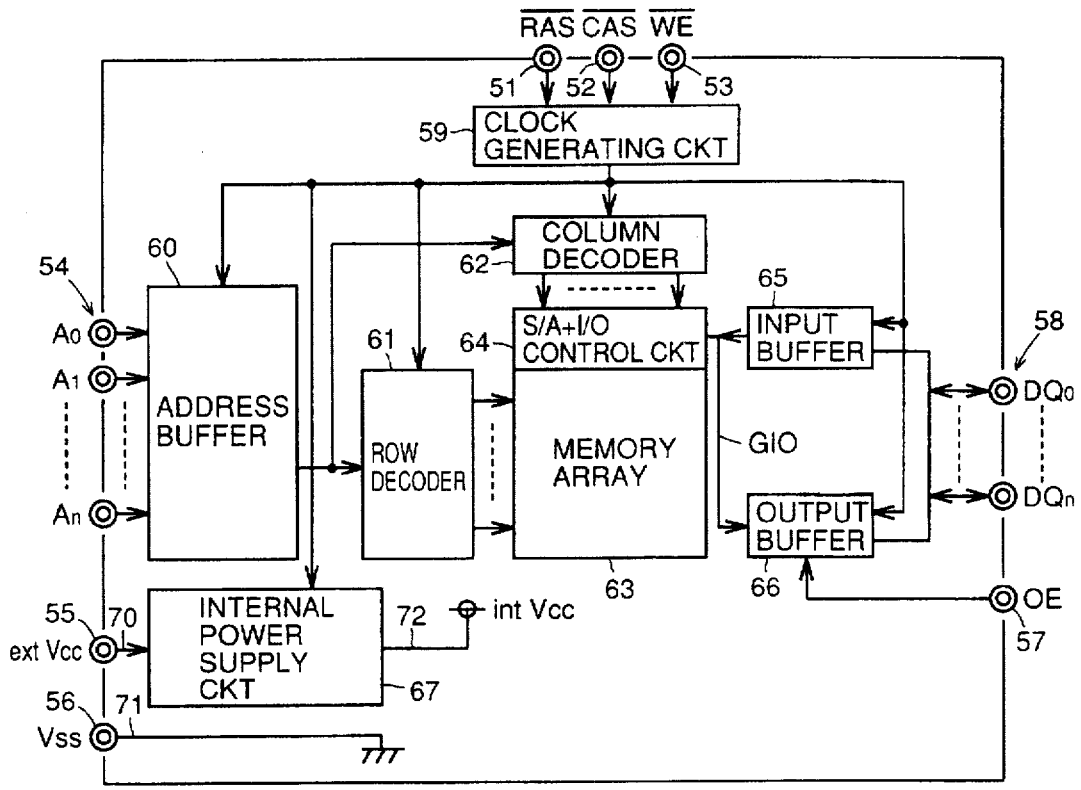
FIG. 11 is a block diagram showing a structure of a conventional DRAM.

FIG. 10 shows the structure of a test mode signal generating circuit 46 in accordance with Embodiment 4 of the present invention. Referring to FIG. 10, test mode signal generating circuit 46 includes a WCBR detecting circuit 47, a high voltage detecting circuit 48 and an address latch+decode circuit 49.

WCBR detecting circuit 47 detects a WCBR timing (at which signals /CAS and /WE are at the "L" level at the fall of the signal /RAS). High voltage detecting circuit 48 detects application of a high voltage to a specific pin (for example, an address pin 54.0 to which address signal A0 is input). Address latch+decode circuit 59 latches input signal A1 to An to other address pins 54.1 to 54.n when these conditions are satisfied, and generates test mode signals $\phi_1$ to $\phi_6$ in accordance with the logic levels of these.

In this embodiment, it is not necessary to provide pads for test mode signal input, which pads are not necessary in the normal mode. Therefore, the chip area can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device for performing a prescribed operation and receiving an external power supply potential and a ground potential, comprising:

internal means receiving said ground potential and an internal power supply potential prepared by lowering said external power supply potential, for performing a prescribed operation;

an output adjustable first potential generating means receiving said external power supply potential and said ground potential, for outputting a first potential higher by a first prescribed voltage than said ground potential;

an output adjustable second potential generating means receiving said external power supply potential and said ground potential for outputting a second potential lower by a second prescribed voltage than said external power supply potential;

potential synthesizing means for outputting said first potential output from said first potential generating means as said internal power supply potential when said external power supply potential is within a prescribed range, and outputting said second potential output from said second potential generating means as said internal power supply potential when said external power supply potential is higher than an upper limit of said prescribed range; and inactivating means for inactivating said second potential generating means when said external power supply potential within said prescribed range is applied to said semiconductor device to adjust the output of said first potential generating means so that said internal power supply potential has a prescribed value, and inactivating said first potential generating means when said external power supply potential, higher than the upper limit of said prescribed range, is applied to said semiconductor device to adjust the output of said second potential generating means so that said internal power supply potential has a second prescribed value.

2. The semiconductor device according to claim 1, wherein said first potential generating means includes an output adjustable first constant current means and a first variable resistance means connected in series between a line of said external power supply potential and a line of said ground potential, and outputs said first potential higher than said ground potential by a voltage obtained by multiplying a current value of said first constant current means and a resistance value of said first variable resistance means, and said second potential generating means includes a second variable resistance means and an output adjustable second constant current means connected in series between a line of said external power supply potential and a line of said ground potential, and outputs said second potential lower by said second prescribed than said external power supply potential obtained by multiplying a resistance value of said second resistance means and a current value of said second constant current means.

3. The semiconductor device according to claim 2, wherein each of said first constant current means, said first variable resistance means, said second variable resistance means and said second constant current means includes a plurality of resistance elements connected in series and a plurality of fuses connected parallel to respective resistance elements, and current value of said first constant current means, resistance value of said first variable resistance means, resistance value of said second variable resistance means and current value of said second constant current means are adjusted by blowing respective fuses of each said means.

4. The semiconductor device according to claim 3, wherein each resistance element is formed by a transistor having a prescribed conduction resistance value.

5. The semiconductor device according to claim 3, wherein said first and second constant current means share at least said plurality of resistance elements connected in series and fuses connected parallel to respective resistance elements.

6. The semiconductor device according to claim 2, wherein said inactivating means includes a first transistor connected between said first constant current means and said first variable resistance means and rendered non-conductive when output of said second potential generating means is to be adjusted, a second transistor connected parallel to said first variable resistance means and rendered conductive when output of said second potential generating means is to be adjusted, a third transistor connected between said second variable resistance means and said second constant current means and rendered non-conductive when output of said first potential generating means is to be adjusted, and a fourth transistor connected parallel to said second constant current means and rendered conductive when output of said first potential generating means is to be adjusted.

7. The semiconductor device according to claim 3, further comprising:

test means provided corresponding to each of said first constant current means, said first variable resistance means, said second variable resistance means and said second constant current means, for simulating, before blowing a fuse of the corresponding means, said first or second potential after blowing of said fuse.

8. The semiconductor device according to claim 7, wherein said test means includes a testing resistance element connected in series to said plurality of resistance elements of the corresponding means, and a fifth transistor connected parallel to said test resistance element and rendered non-conductive at the time of said testing.

9. The semiconductor device according to claim 8, further comprising signal generating means responsive to an externally applied signal for applying control signals to input electrodes of said first to fifth transistors.

10. In a semiconductor device including an output adjustable first potential generating means receiving an external power supply potential and a ground potential for outputting a first potential higher than said ground potential by a first prescribed voltage, an output adjustable second potential generating means receiving said external power supply potential and said ground potential, for outputting a second potential lower than said external power supply potential by a second prescribed voltage, potential synthesizing means for outputting said first potential output from said first potential generating means as an internal power supply potential when said external power supply potential is within a prescribed range, and for outputting said second potential output from said second potential generating means as said internal power supply potential when said external power supply potential is higher than an upper limit of said prescribed range, and internal means receiving said internal power supply potential output from said potential synthesizing means and said ground potential for performing a prescribed operation, a method of adjusting said internal power supply potential, comprising the steps of:

applying external power supply potential within said prescribed range to said semiconductor device while simultaneously inactivating said second potential generating means to adjust the output of said first potential generating means so that said internal power supply potential has a prescribed value; and thereafter, applying external power supply potential higher than the upper limit of said prescribed range to said semiconductor device while simultaneously inactivating said first potential generating means to adjust the output of said second potential generating means so that said internal power supply potential has a second prescribed value.

* * * * *